United States Patent [19]

Telco

[11] Patent Number: 5,025,553

[45] Date of Patent: Jun. 25, 1991

[54] CIRCUIT BOARD MANUFACTURE

[75] Inventor: Paul Telco, Hertfordshire, United Kingdom

[73] Assignee: Telco International, Ltd., England

[21] Appl. No.: 415,718

[22] Filed: Oct. 2, 1989

[30] Foreign Application Priority Data

Oct. 6, 1988 [GB] United Kingdom ............... 8823537

[51] Int. Cl.$^5$ .............................................. H01K 3/10
[52] U.S. Cl. ...................................... 29/852; 29/739; 29/845; 29/846
[58] Field of Search ................. 29/846, 852, 853, 845, 29/739

[56] References Cited

U.S. PATENT DOCUMENTS 4,183,137 1/1980 Lomerson .
4,562,301 12/1985 Kameda et al. ................... 29/845 X
4,644,643 2/1987 Sudo ..................................... 29/845

FOREIGN PATENT DOCUMENTS 335420 10/1989 European Pat. Off. ............. 29/739
A902463 8/1962 United Kingdom .
1087604 10/1967 United Kingdom .
1177831 7/1970 United Kingdom ................... 29/845

OTHER PUBLICATIONS

IBM Technical Disclosure Bulletin, vol. 11, No. 8, Jan. 1969, p. 992, Armonk, N.Y., U.S.; T. L. Ellis: "Injected Interconnections".
IBM Technical Disclosure Bulletin, vol. 12, No. 4, Sep. 1969, p. 596, Armonk, N.Y., U.S.; F. W. Eurglunes: "Via Hole Filling Technique".
Machine Design, vol. 46, No. 27, Nov. 14, 1974, p. 82, Cleveland, U.S.; "Lead Alloy Preforms Speed up Assembly Operations".
Technique Rundschau, vol. 64, No. 5, Feb. 4, 1972, pp. 39–43, Bern, CH; "Loten von Kupfer und Kupferlegierungen".
IBM Tech Disclosure Bulletin, vol. 8, No. 11, Apr. 1966, p. 1494 by Byrnes.
IBM Tech Disclosure Bulletin, vol. 15, No. 8, Jan. 1973, p. 2492 by Avg.
Engineering Design News, Feb. 1963, pp. 118–119.

Primary Examiner—Carl J. Arbes
Attorney, Agent, or Firm—Nixon & Vanderhye

[57] ABSTRACT

Electrically conductive patterns on opposite sides of a printed circuit board are connected by way of through holes formed in the board. A plug formed of fusible material such as solder and having an electrically conductive coating is located in the or each hole. The plug is upset to expand it so that the electrically conductive coating contacts the wall of the hole. Solder is applied to opposite ends of the plug to bridge any gap between the conductive pattern and the conductive coating. The body of the plug may then be removed by a desoldering step.

20 Claims, 2 Drawing Sheets

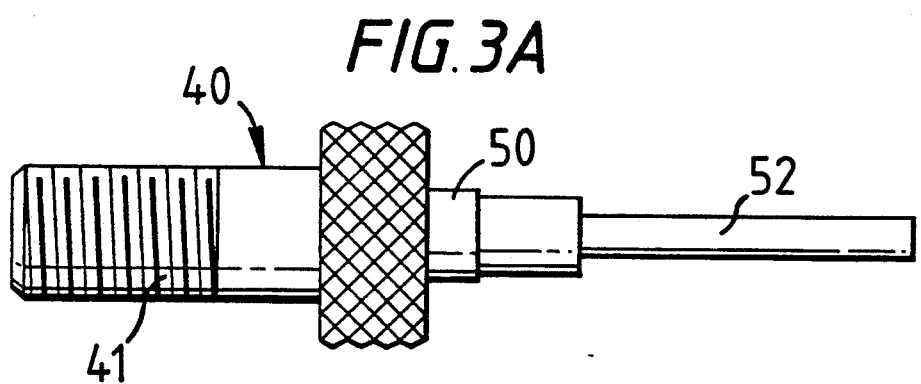

CIRCUIT BOARD MANUFACTURE

This invention relates to the manufacture of printed circuit boards. The invention has particular application to the manufacture of circuit boards which are used for electronics assembly. In particular the invention relates to a method for producing printed circuit boards of the type which have conductive patterns formed on opposite faces of a substrate (known as double sided printed circuit boards) and those boards with additional layers of conductive patterns (known as multilayer printed circuit boards), the conductive patterns being electrically connected via connections located in through holes formed in the substrate. These are often known as "plated through holes", because they are normally formed by an electroplating process. However it is expensive to produce small quantities of plated through hole boards. It is also difficult to repair a hole that has a faulty plating. It is envisaged that the invention will have particular application to the production of prototype circuit boards which are produced in relatively small volumes, and for the repair of holes with damaged or faulty plating.

Printing circuit boards comprising a dielectric substrate and having electrically conductive patterns formed on opposite faces of that substrate are used extensively in electrical applications. The conductive patterns on the opposite faces of the substrate require connection and this is usually done by forming through holes in the substrate and making an electrical connection between copper pads at opposite ends of those holes. There are several known prior art techniques for forming such a connection, but in general these are either relatively complex or do not produce satisfactory results. In addition to the above-mentioned expensive plating method, there is another known technique described in GB-A-203007 which involves mounting the circuit board so that low pressure is applied to the side of the board which is not in the process of being screen printed so that when the conductive pattern is applied to the surface of the substrate some of the material which forms the conductive pattern is drawn down through the holes to form a surface-to-surface conductive coating on the wall of the hole.

Another prior art arrangement involves locating an eyelet in each hole, the eyelet resembling a rivet. A disadvantage of this technique is that, for a typical hole size of 0.8 mm diameter at the center of a copper pad around the hole which is typically 1.5 mm in diameter, it is necessary to drill out the hole to accept the thickness of the eyelet and then, after insertion of the eyelet, folded over ends of the eyelet cover virtually the entire pad and there is not sufficient space for making a soldered connection between the head of the eyelet and the pad to ensure electrical continuity. The heads of the eyelets can oxidise and it is essential to solder the heads of the eyelets to the copper pad to ensure a reliable electrical connection.

The present invention is concerned with a method for forming printed circuit boards of the above-mentioned type which is relatively simple and easy to perform.

According to one aspect of the present invention there is provided a method of interconnecting conductive patterns formed on opposite sides of a printed circuit board via a through hole or holes formed in said printed circuit board which comprises locating in the or each hole a plug comprising a body of fusible material which is coated on its surface with an electrically conductive layer, and applying solder or like material to opposite ends of the or each plug so that the solder bridges any gap between the conductive patterns and the conductive layer. The method may include the step of subjecting the resulting arrangement to a de-soldering step to leave a conductive layer covering the wall of the or each hole. This is necessary where for example the hole is required to accommodate a component.

The method may include the step of mechanically upsetting the plug prior to application of said solder. The plugs may be formed by cutting appropriate lengths of a rod formed from a fusible material having an electrically conductive coating, for example, a rod of copper coated solder.

The electrically conductive coating can have a thickness in the range 5 to 50 μm. It may be formed by electroplating lengths of the fusible material using a conventional electroplating technique.

Prior to the upsetting step the length of each plug is greater than the depth of each hole. The length of each plug should be sufficient to enable the plug to be expanded during upsetting so that its conductive coating moves into contact with the wall of the hole. In one form of the method the plugs are substantially flush with the surface of the substrate after the upsetting step.

It is also possible to use longer plugs, e.g. 20% longer than the length of each hole, so that after upsetting a portion of the electrically conductive coating becomes folded over around each end edge of the hole.

Another aspect of the invention provides a plug for use in the method according to said one aspect, said plug comprising a body of fusible material and a coating of electrically conductive material on the body. The fusible material can be solder and may be a flux-cored solder.

The invention will be described now by way of example only, with particular reference to the accompanying drawings. In the drawings:

FIG. 3A is a view similar to FIG. 3 showing the body portion only of the punch.

Figure 1A:
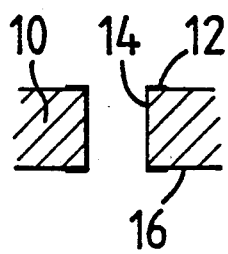
FIGS. 1A to 1F illustrate the sequence of steps which make up a method in accordance with the present invention.

Referring to FIG. 1A there is shown a partial section through a printed circuit board which comprises a dielectric substrate 10 having electrically conductive patterns formed on its upper surface 12 and on its lower surface 16. These patterns can be formed in a conventional manner. The substrate 10 has a number of through holes 14 (only one is shown in FIG. 1A for simplicity) which enable conductive patterns on the opposite faces of the substrate to be connected by the method to be described.

Figure 1B:
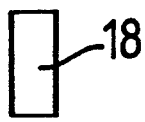
Figure 1C:
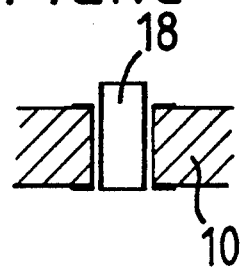
Figure 1D:
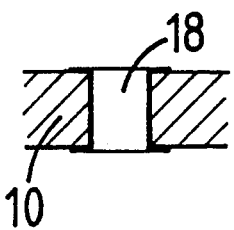
Figure 1E:
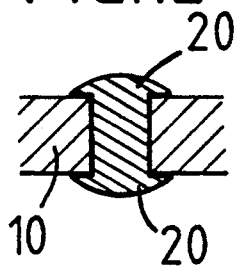
Figure 1F:
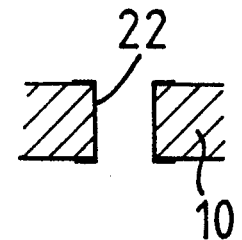

Referring to FIG. 1B the next step is to form a plug of copper coated solder 18. This can be achieved by cutting the appropriate length from a rod of copper coated solder. The rod can be formed by electroplating copper on to a length of solder wire. The copper can have a thickness of about 25 μm. This plug is then inserted in the through hole formed in the substrate as shown in FIG. 1C. The plug is then mechanically upset so that its ends are substantially flush with the upper and lower surfaces of the substrate as shown in FIG. 1D. The mechanical upsetting process also ensures that the cylindrical surface of the plug securely contacts the wall of the hole. The next step in the process is to apply solder 20 to opposite ends of the plug as shown in FIG. 1E. This can be achieved by applying flux-cored solder with a soldering iron. The purpose of this is to ensure that there is a connection between the conductive patterns formed on each surface of the substrate and the copper coating on the soldered plug. In effect the solder applied to the opposite ends of the plug bridges any gaps which may be present. The final step which may be optional is illustrated in FIG. 1F and is a de-soldering step in which the main body of the solder plug is removed to leave a copper coating 22 on the cylindrical walls of the hole. This coating and the remaining solder forms the electrical connection between the conductive patterns on the upper and lower surfaces of the substrate 10. Typically the coating has a thickness of 20-25 μm.

As an alternative to a solid solder plug, a flux-cored solder plug may be used. Such plugs may be cut from a length of flux-cored solder with an electrically conductive coating. This can be formed by electroplating copper onto a length of flux-cored solder wire. The copper coating on the plug may itself have a protective coating. This may be a chemical preservative or may comprise a solder or tin plating which helps to preserve the solderability of the copper and this facilitates the soldering of the copper layer to the lands of the printed circuit board at opposite ends of each through hole.

Any conventional solder can be used including, for example, alloys of tin and lead with optional additions of silver antimony or bismuth. A particularly advantageous solder is an alloy of tin, lead and copper. Examples which can be used are the commercially available Savbit 1 alloy (50% tin, 1.5% copper and 48.5% lead) and Savbit 6 alloy (60% tin, 2% copper and 38% lead). The word "Savbit" is a Trade Mark. The use of an alloy of this form assists in preventing dissolution of the copper plating by the solder itself as tin, lead and copper Savbit alloys are saturated solutions of copper.

The removal of the solder core of the plug from the hole can be carried out using a heated suction tool such as one of those known for removing solder from holes in printed circuit boards. Alternatively a desoldering braid may be employed, for example the commercially available Xersin wick.

The upsetting step which causes the the plug to be expanded so that the electrically conductive coating comes into contact with the wall of the hole, can be carried out using a spring loaded punch. It should be noted that the succeeding soldering step (FIG. 1E) may be omitted (i.e. the plug can be self soldering) if flux cored solder wire is used or if additional liquid flux is applied to a plug which is solder cored, i.e. the end part of each plug is soldered to the copper lands at each end of the hole using solder which forms the plug and the flux.

Figure 2:
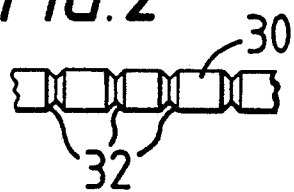
FIG. 2 shows a rod of fusible material from which plugs for use in the present method can be obtained.

It has been found that formation of the plugs and their location in the holes in the board can be facilitated by forming circumferential grooves in the rod from which they are obtained. This is illustrated in FIG. 2 which shows a rod 30 of fusible material which has on its surface a coating of electrically conductive material. Circumferential grooves 32 are formed in he rod, successive grooves being spaced longitudinally by a distance corresponding to the length of a plug. The grooves can be machined on a lathe. By using an appropriate form of lathe this operation can be carried out substantially automatically.

The plugs can be dispensed from the rod using the body of a collet type pencil in which the lead is conventionally projected by successive actuation of a push button on one end of the body. The rod is inserted into the body of a conventional collet type pencil in place of the usual lead. The only adjustment that might be necessary is to appropriately set the collets according to the diameter of the rod. The pencil is operated in a conventional manner to project the rod until the length of the projecting portion is sightly greater than the length of a plug. The projecting portion is located in a hole in the board and the plug is broken off form the rod by tilting the pencil body. The break occurs at a circumferential groove. This is repeated for other holes to be coated.

Figure 3:
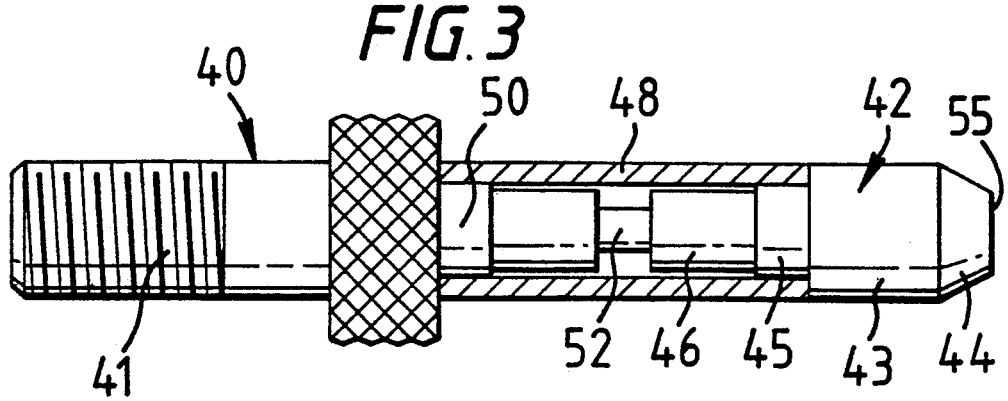
FIG. 3 is a side view partly in section of a spring loaded punch suitable for use in the present invention.

A punch assembly which can be used for the upsetting step is illustrated in FIGS. 3 and 3A of the drawings. This essentially comprises body part 30 which can be screwed into the body of a conventional spring action punch by means of threads 41. The body part is indicated at 40 is connected to a nose portion 42 by a sleeve 48. The nose portion 42 comprises a first tubular body part 43 having a tapering end 44, a second tubular body part 45 extending coaxially from the first part, and a third tubular body part 46 extending coaxially from the second part. The sleeve 48, which is formed of elastomeric material, extends between the nose portion 42 and the body 40. The sleeve is fixed to the second body part 45 and to a similar part 50 on the body 40 by a suitable adhesive such as cyanoacrylate adhesive.

A punch pin 52 extends from the body 40 into the bore of the tubular nose portion 42. This pin may be formed as an integral part of the punch body or may be a separate component inserted into a hole in the body and fixed therein by adhesive, e.g. Loctite (Trade Mark). The dimensions of the various elements are such that when the body and nose portion are closed up and come into contact, the end face of the pin 52 is flush with the end face 55 of the nose portion 42. The diameter of the through bore of the nose portion 42 corresponds to the diameter of each hole in the board.

In use the punch is located over a hole into which a plug has been inserted. The upper part of the plug locates in the lower, open end portion of the bore of the nose portion 42. The punch is then operated in a conventional manner such that the lower end of the punch pin 52 strikes the plug to compress it axially and thereby expand it radially so that the electrically conductive coating contacts the wall of the hole. The tubular nose portion assists in maintaining axial alignment of the punch and the plug.

The elastomeric sleeve 48 which connects the body and nose portion, permits movement of the body 40 towards the nose portion 42 during this operation.

I claim:

1. A method of interconnecting conductive patterns which are formed on opposite sides of a printed circuit board via a through hole or holes formed in said printed board, said method comprising:

locating in the or each hole a plug comprising a body of fusible material which is coated on its surface with an electrically conductive material thereby forming a layer and having a melting temperature higher than the melting temperature of the fusible material, and applying solder material to opposite ends of the or each plug so that the solder bridges may gap between the conductive patterns and the conductive layer.

2. A method of interconnecting conductive patterns which are formed on opposite sides of a printed circuit board via a through hole or holes formed in said printed board, said method comprising locating in the or each hole a plug comprising a body of fusible material which is coated on its surface with an electrically conductive material, thereby forming a layer and applying solder material to opposite ends of the or each plug so that the solder bridges any gap between the conductive patterns and the conductive layer, wherein the fusible material is solder.

3. A method of interconnecting conductive patterns which are formed on opposite sides of a printed circuit board via a through hole or holes formed in said printed board, said method comprising locating in the or each hole a plug comprising a body of fusible material which is coated on its surface with an electrically conductive material thereby forming a layer, and applying solder material to opposite ends of the or each plug so that the solder bridges any gap between the conductive patterns and the conductive layer, wherein the fusible material is flux cored solder.

4. A method of interconnecting conductive patterns which are formed on opposite sides of a printed circuit board via a through hole or holes formed in said printed board, said method comprising locating in the or each hole a plug comprising a body of fusible material which is coated on its surface with an electrically conductive material thereby forming a layer, and applying solder material to opposite ends of the or each plug so that the solder bridges any gap between the conductive patterns and the conductive layer, including the step of removing the body of fusible material from the or each plug so as to leave an electrically conductive layer covering the wall of the or each hole.

5. A method of interconnecting conductive patterns which are formed on opposite sides of a printed circuit board via a through hole or holes formed in said printed board, said method comprising locating in the or each hole a plug comprising a body of fusible material which is coated on its surface with an electrically conductive material thereby forming a layer, and applying solder material to opposite ends of the or each plug so that the solder bridges any gap between the conductive patterns and the conductive layer, including the step of mechanically upsetting the or each plug prior to application of the solder material.

6. A method of interconnecting conductive patterns which are formed on opposite sides of a printed circuit board via a through hole or holes formed in said printed board, said method comprising:

locating in the or each hole a plug comprising a body of fusible material which is coated on its surface with an electrically conductive material thereby forming a layer, and applying solder material to opposite ends of the or each plug so that the solder bridges any gap between the conductive patterns and the conductive layer;

wherein each plug has been cut from a rod of solder coated with electrically conductive material.

7. A method according to claim 6 wherein the electrically conductive material is copper.

8. A method according to claim 6 wherein the solder is an alloy of tin, lead and copper.

9. A method according to claim 8 wherein the composition of the alloy is 50% tin, 1.5% copper and 48.5% lead.

10. A method according to claim 8 wherein the composition of the alloy is 60% tin, 2% copper and 38% lead.

11. A method according to claim 1 wherein the electrically conductive material has thereon a coating of protective material.

12. A method according to claim 11 wherein the protective coating comprises a chemical preservative or a solder or tin plating.

13. A method for electrically connecting conductive patterns on different levels of a circuit board via a hole formed in the board, said method comprising the steps of:

disposing within said hole a plug having a fusible metal core coated with an outer layer of a different electrical conductor material, said fusible metal core having a lower melting temperature than said electrical conductor material, radially expanding said plug within said hole to force the electrical conductor material into contact with the hole wall, and soldering at least one axial end of the plug electrical conductor material to at least one of said conductive patterns.

14. A method as in claim 13 wherein said conductive patterns are disposed on opposite sides of the circuit board, said hole is a through hole and each axial end of said plug electrical conductor material is soldered to a respectively associated conductive pattern.

15. A method as in claim 14 wherein said plug has an axial length longer than the axial length of said hole and wherein said radially expanding step is carried out by axially compressing said plug within said hole.

16. A method as in claim 15 wherein said axially compressing step includes deformation of the ends of the plug electrical conductor material radially out onto said conductive patterns.

17. A method as in claim 13 further comprising the step of:

melting and removing at least the central portion of the fusible plug core from said hole to leave a central opening and an outer conductive layer coupling within and through said hole.

18. A method as in claim 13 including the step of:

severing said plug from an extended rod having a fusible core coated with electrical conductor material.

19. A method as in claim 18 including a prior step of circumferentially grooving said rod at predetermined axial spacings corresponding to predetermined axial core dimensions.

20. A method as in claim 13 wherein said radially expanding step comprises:

aligning a spring operable punch pin with said core and axially actuating said punch pin so as to axially compress said plug within said hole.

* * * * *